US008935672B1

(12) United States Patent
Thuneman et al.

(10) Patent No.: US 8,935,672 B1
(45) Date of Patent: *Jan. 13, 2015

(54) LAZY EVALUATION OF GEOMETRIC DEFINITIONS OF OBJECTS WITHIN PROCEDURAL PROGRAMMING ENVIRONMENTS

(75) Inventors: Paul Zack Thuneman, Snoqualmie, WA (US); Thomas A. Grandine, Issaquah, WA (US); Jan H. Vandenbrande, Sammamish, WA (US); Gregory Mikel Anderson, Seattle, WA (US)

(73) Assignee: The Boeing Company, Chicago, IL (US)

( * ) Notice: Subject to any disclaimer, the term of this patent is extended or adjusted under 35 U.S.C. 154(b) by 26 days.

This patent is subject to a terminal disclaimer.

(21) Appl. No.: 13/618,278

(22) Filed: Sep. 14, 2012

Related U.S. Application Data (63) Continuation of application No. 12/045,560, filed on Mar. 10, 2008, now Pat. No. 8,302,078.

(51) Int. Cl.
G06F 9/44 (2006.01)
G06F 9/45 (2006.01)

(52) U.S. Cl.
USPC .............................. 717/125; 717/137; 717/157

(58) Field of Classification Search
None
See application file for complete search history.

(56) References Cited

U.S. PATENT DOCUMENTS

| 7,155,673 | B2 | 12/2006 | Stewart et al. | |
|---|---|---|---|---|
| 7,280,107 | B2 | 10/2007 | Whitted et al. | |
| 7,363,621 | B2* | 4/2008 | Takeuchi | 717/157 |
| 7,414,623 | B2 | 8/2008 | Whitted et al. | |
| 7,414,626 | B1* | 8/2008 | Picott | 717/157 |
| 7,464,373 | B1* | 12/2008 | Yunt et al. | 717/125 |
| 7,623,139 | B1 | 11/2009 | Gifford et al. | |
| 8,055,949 | B2* | 11/2011 | Haskell | 717/125 |
| 8,261,240 | B2* | 9/2012 | Hoban et al. | 717/125 |
| 8,302,078 | B2* | 10/2012 | Thunemann et al. | 717/125 |
| 2002/0120920 | A1* | 8/2002 | Jayaram et al. | 717/137 |
| 2005/0155008 | A1* | 7/2005 | Archambeault et al. | 717/125 |

(Continued)

OTHER PUBLICATIONS

Pion et al., "A Generic Lazy Evaluation Scheme for Exact Geometric Computations", 2010 Elsevier B.V., pp. 307-323; <http://www.sciencedirect.com/science/article/pii/S016764231000167X>.*

(Continued)

Primary Examiner — Thuy Dao
Assistant Examiner — Ben C Wang
(74) Attorney, Agent, or Firm — Hope Baldauff, LLC (57) ABSTRACT

This description provides tools for lazy evaluation of geometric definitions of objects within procedural programming environments. Computer-based methods provided by these tools may parse input program code that includes statements that are syntactically consistent with a procedural programming language. These statements may also include defined functions that are not syntactically consistent with the procedural programming language. The defined functions may be associated with a given function that is defined according to the procedural programming language. The given function may relate to a geometric design of an object. The methods may identify inputs and outputs to this given function, and may build a dependency graph that relates this given function to other functions, based on the inputs and/or outputs of the given function. The methods may delay evaluating the given function until a triggering event occurs, at which time the methods may evaluate the given function to produce the output.

9 Claims, 4 Drawing Sheets

(56) References Cited

U.S. PATENT DOCUMENTS

| | | | |
|---|---|---|---|
| 2007/0002066 | A1 | 1/2007 | Whitted et al. |
| 2007/0165035 | A1 | 7/2007 | Duluk et al. |
| 2007/0279414 | A1 | 12/2007 | Vandenbrande et al. |
| 2008/0162205 | A1 | 7/2008 | Gross |
| 2009/0183142 | A1* | 7/2009 | Hoban et al. ............... 717/125 |
| 2010/0095282 | A1* | 4/2010 | Thunemann ............... 717/137 |
| 2011/0265070 | A1 | 10/2011 | Meijer et al. |

OTHER PUBLICATIONS

John C. Hart, "On Efficiently Representing Procedural Geometry", 2008 Washington State University, pp. 5-1-5-20; <http://www.cs.duke.edu/courses/cps124/spring08/assign/07_papers/hart_pginotes.pdf>.*

Funke et al., "LOOK : A Lazy Object-Oriented Kernel Design for Geometric Computation", 2001 Elsevier Science B.V., pp. 99-118 <http://www.sciencedirect.com/science/article/pii/S0925772101000463>.*

Kasik et al., "Course Notes: Massive Model Visualization Techniques", 2008 ACM, SIGGRAPH '08 ACM SIGGRAPH 2008 classes, pp. 1-188; <http://dl.acm.org/citation.cfm?doid=1401132.1401190>.*

Peter Van Weert, "Efficient Lazy Evaluation of Rule-Based Programs", 2010 IEEE, pp. 1521-1534; <http://ieeexplore.ieee.org/stamp/stamp.jsp?tp=&arnumber=5342423>.*

Alex Aiken, CS 264 Lecture Notes entitled "Lazy Evaluation" dated Spring, 1995. Reference material printed from website address: http://www.cs.berkeley.edu/~aiken/cs264/lectures/lazy_evaluation; 5 pages.

Nguyen, et al., Abstract entitled "Design Patterns for Lazy Evaluation," Reference material printed from website address: http://www.cs.rice.edu/~javaplt/papers/sigcse2000.pdf; SIGCSE '00 Proceedings of the thirty-first SIGCSE technical symposium on Computer science education, Mar. 2000; 5 pages.

Reference material entitled "Lazy evaluation" printed from Wikipedia website address: http://en.wikipedia.org/wiki/Lazy_evaluation on Jul. 3, 2008; 2 pages.

Reference material entitled "Memoization" printed from Wikipedia website address: http://en.wikipedia.org/wiki/Memoization on Jul. 3, 2008; 7 pages.

U.S. Office Action dated Aug. 22, 2011 in U.S. Appl. No. 12/045,560.
U.S. Office Action dated Feb. 28, 2012 in U.S. Appl. No. 12/045,560.
Pion et al., "A Generic Lazy Evaluation Scheme for Exact Geometric Computations," published Aug. 2006, INRIA, pp. 1-20, <ftp://ftp-sop.inria.fr/prisme/pion/publis/lazy-kernel-RR.pdf>.
U.S. Notice of Allowance dated Jun. 14, 2012 in U.S. Appl. No. 12/045,560.

* cited by examiner

LAZY EVALUATION OF GEOMETRIC DEFINITIONS OF OBJECTS WITHIN PROCEDURAL PROGRAMMING ENVIRONMENTS

CROSS REFERENCE TO RELATED APPLICATIONS

This application is a continuation of U.S. application Ser. No. 12/045,560, entitled "Lazy Evaluation of Geometric Definitions of Objects Within Procedural Programming Environments," filed Mar. 10, 2008, and published as U.S. Pat. No. 8,302,078 B2 on Oct. 30, 2012, which is incorporated herein by reference in its entirety.

BACKGROUND

Computer-aided design and engineering packages are increasingly used within the industry to expedite designing, prototyping, testing, and improving various vehicles and systems. Generally, relatively powerful computing systems may run these design and engineering packages. However, as designs for these vehicles and systems become more complex, these computing systems may become increasingly burdened, and therefore may become less responsive to user commands.

SUMMARY

It should be appreciated that this Summary is provided to introduce a selection of concepts in a simplified form that are further described below in the Detailed Description. This Summary is not intended to limit the scope of the claimed subject matter.

This description provides tools for lazy evaluation of geometric definitions of objects within procedural programming environments. Computer-based methods provided by these tools may parse input program code that includes statements that are syntactically consistent with a procedural programming language. These statements may also include defined functions that are not syntactically consistent with the procedural programming language. The defined functions may be associated with a given function that is defined according to the procedural programming language. The given function may relate to a geometric design of an object. The methods may identify inputs and outputs to this given function, and may build a dependency graph that relates this given function to other functions, based on the inputs and/or outputs of the given function. The methods may delay evaluating the given function until a triggering event occurs, at which time the methods may evaluate the given function to produce the output.

The features, functions, and advantages discussed herein may be achieved independently in various embodiments of the present description or may be combined in yet other embodiments, further details of which can be seen with reference to the following description and drawings.

DETAILED DESCRIPTION

The following detailed description provides various tools and techniques for lazy evaluation of geometric definitions of objects within procedural programming environments. This description proceeds with reference to various drawings, and to numerals appearing within the drawings. The first digit within a given reference numeral indicates the drawing in which that numeral first appears.

Figure 1:
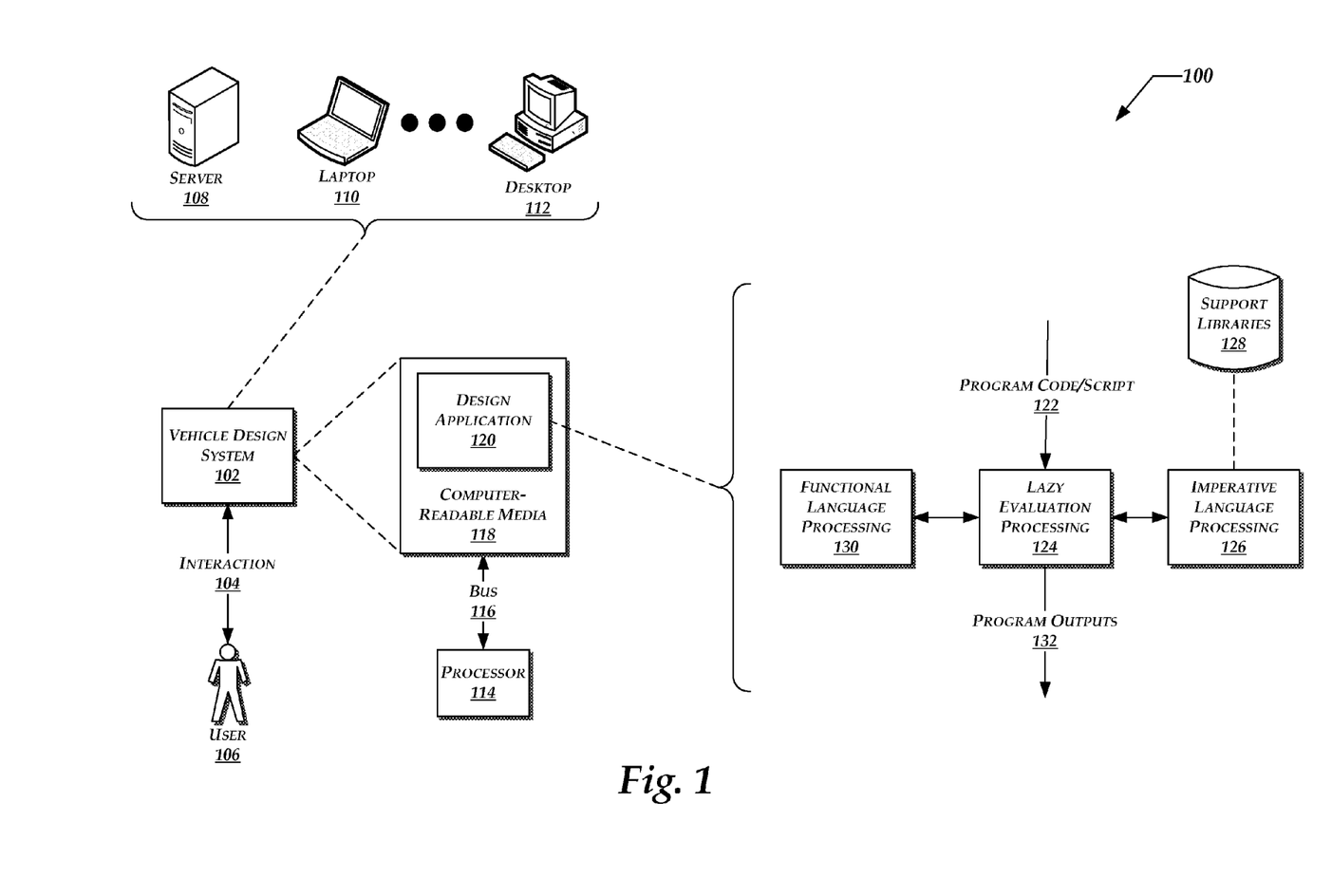
FIG. 1 illustrates systems or operating environments for the lazy evaluation of geometric definitions of objects within procedural programming environments.

FIG. 1 illustrates systems or operating environments, denoted generally at 100, for the lazy evaluation of geometric definitions of objects within procedural programming environments. For ease of description, and without limiting possible implementations, the term "lazy" as used herein refers to deferring the evaluation of expressions or functions until some event or trigger occurs.

This description generally refers to evaluating functions. However, this terminology is chosen only for example, and not to exclude equivalent expressions or to limit possible implementations. For example, the terminology "construction of a class instance" may be suitable as well.

These systems 100 may include one or more vehicle design systems 102. Vehicle design systems may be configured to support interactions 104 with one or more users 106. For example, and without limitation, the users 106 may be engineers, system designers, programmers, analysts, or the like. In addition, subsequent drawings provide more detail and examples relating to the interactions 104.

FIG. 1 illustrates several examples of platforms that may host the vehicle design systems 102. These examples may include one or more server-based systems 108, one or more portable computing systems 110 (whether characterized as laptops, notebooks, or other types of mobile computing systems), and/or one or more relatively stationary desktop computing systems 112.

Implementations of this description may include other types of platforms as well, with FIG. 1 providing non-limiting examples. For example, the description herein contemplates other platforms for implementing the vehicle design systems, including but not limited to wireless personal digital assistants, smartphones, or the like. Thus, FIG. 1 provides the graphical elements used to depict these various components only to facilitate illustration, and not to limit possible implementations of the description herein.

As detailed elsewhere herein, the vehicle design systems 102 may enable the users to interactively design, model, and/or prototype various complex mechanical systems, such as aircraft, boats, vehicles, spacecraft or the like. Generally, the vehicle design systems may support design efforts relating to any air-based, ground-based, or sea-based vehicles.

Turning to the vehicle design systems 102 in more detail, these systems may include one or more processors 114, which may have a particular type or architecture, chosen as appropriate for particular implementations. The processors 114 may couple to one or more bus systems 116 that are chosen for compatibility with the processors 114.

The vehicle design systems 102 may include one or more instances of computer-readable storage media 118, which couple to the bus systems 116. The bus systems may enable the processors 114 to read code and/or data to/from the computer-readable storage media 118. The media 118 may represent storage elements implemented using any suitable technology, including but not limited to semiconductors, magnetic materials, optics, or the like. The media 118 may include memory components, whether classified as RAM, ROM, flash, or other types, and may also represent hard disk drives.

The storage media 118 may include one or more modules 120 of instructions that, when loaded into the processor 114 and executed, cause the vehicle design systems 102 to enable the users 106 to participate in design actions. For example, the modules 120 may include one or more design applications that provide an interactive experience for the users 106. These modules 120 may implement the various algorithms and models described and illustrated herein.

Turning to the example design application 120 in more detail, the design application may enable the users 106 to provide or generate instances of program code or script, denoted generally at 122. Generally, the program code/script 122 represents sequences of instructions that the design application 120 may execute while supporting the efforts of the users 106. Various examples of the program code/script 122 are described below.

As shown in FIG. 1, the design application 120 may include components related to lazy evaluation processing, denoted generally at 124. The lazy evaluation components 124 may cooperate with components 126, which generally represent subsystems and utilities related to supporting a given imperative programming language. Examples of such utilities may include compilers, developers toolkits, or the like. Illustrative, but non-limiting examples of programming languages may include Python, Jython, Java, C, Groovy, or the like. Generally, these programming languages are procedural in nature, and may be chosen as appropriate for particular design applications.

FIG. 1 also illustrates at 128 various support libraries associated with the imperative language processing components 126. These support libraries 128 may include libraries of built in functions, for example.

The lazy evaluation processing components 124 may also cooperate with components 130 that support programming operations typically associated with functional or declarative languages. Typically, users 106 (e.g., engineers, scientific analysts, or other highly-trained design personnel) are trained and comfortable with procedural or imperative programming languages. However, as described in further detail herein, designs of complex mechanical systems or vehicles may involve the construction and recomputing of computationally-intensive geometric models. Recomputing the entire geometric model for each change or update made by the user 106 may consume considerable system resources (e.g., processor 114 cycles). In some cases, delays entailed by these recompute functions may decrease system responsiveness and degrade the overall user experience. For example, a previously interactive user experience may become less interactive, with corresponding increases in user wait times.

As shown in FIG. 1, the lazy evaluation processing components 144 may cooperate with the imperative language processing components 126 and the functional language processing components 130 to generate program outputs 132 in response to the input program code/script 122. More specifically, the interactions 104 may represent any number of discrete instances in which the user 106 may provide program code/script 122 or other commands to the system 102, and received in response thereto the program outputs 132. Subsequent drawings and discussion provide more detail on the processing performed by these components.

Having described the overall systems or operating environments 100, the discussion now proceeds to a description of illustrative examples that apply the tools and techniques for lazy evaluation of geometric definitions of objects within procedural programming environments. This discussion is now presented with FIG. 2.

Figure 2:
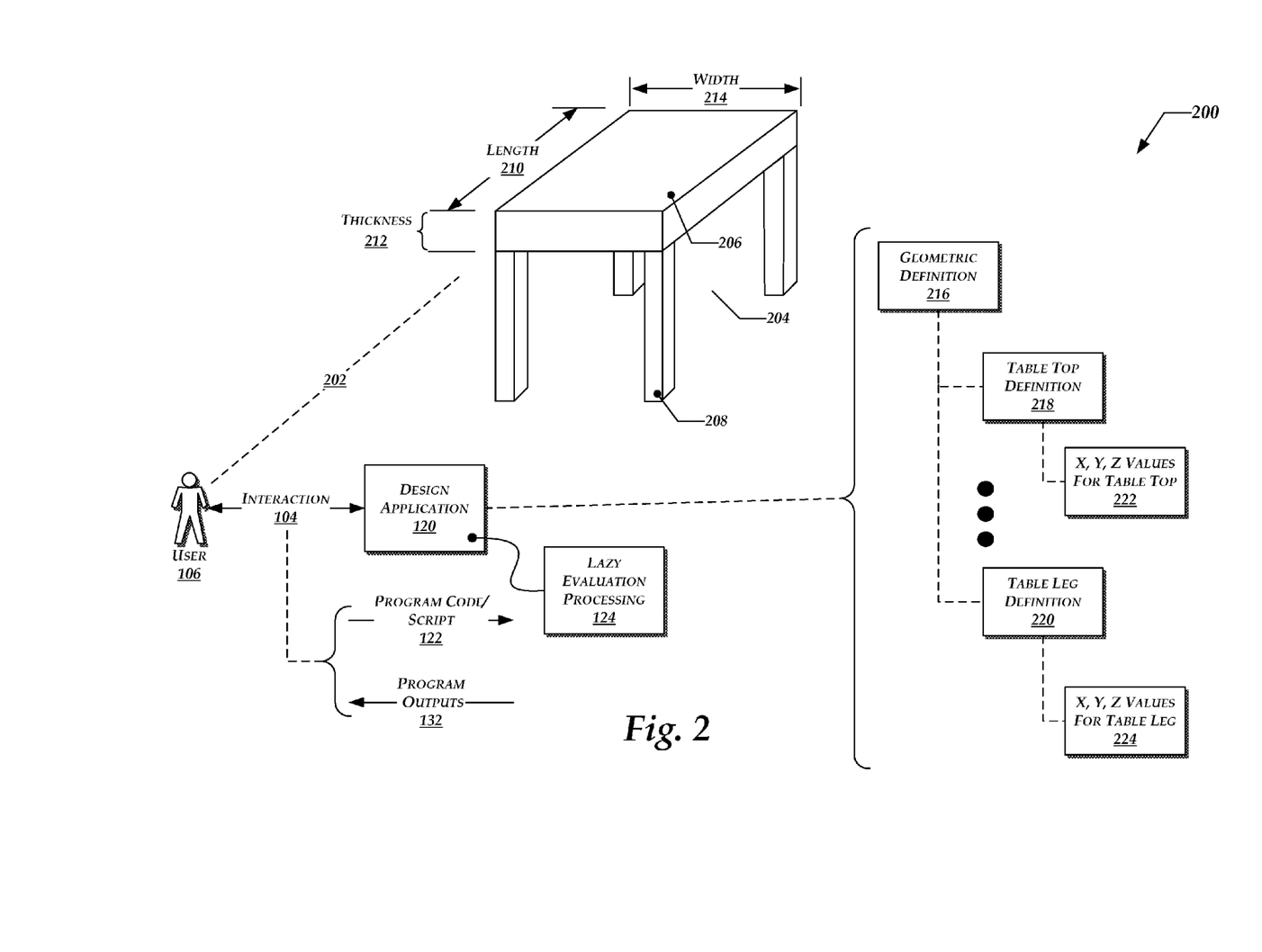
FIG. 2 illustrates example applications for the lazy evaluation of geometric definitions of objects within procedural programming environments.

FIG. 2 illustrates example applications, denoted generally at 200, for lazy evaluation of geometric definitions of objects within procedural programming environments. To facilitate reference and description, but not to limit possible implementations, FIG. 2 may carry forward some items described previously, as denoted by similar reference numbers.

FIG. 2 depicts an example user (e.g., 106) interacting with a suitable design application (e.g., 120) in connection with designing an example object or device, as represented generally by the dashed line 202. FIG. 2 provides an example in which this device is a table 204. However, possible implementations may apply this description to design any number and/or type of different devices, vehicles, or systems, and FIG. 2 provides the example shown only for ease of description.

As described previously in FIG. 1, interaction 104 may represent any number of instances in which the user may provide program code/script (e.g., 122) to the design application 120, and may receive program outputs (e.g., 132) in response thereto. For example, the program code/script instances 122 may represent commands given by the user to add new elements to an ongoing design, to modify some aspect of existing design elements, to delete design elements, or (more generally) to provide any number or type of arbitrary commands or directives to the design application 120. The program outputs 132 may take any suitable form, including but not limited to, visual presentations of geometric models of an ongoing design, recomputed parameters or visualizations associated with these parameters, or the like.

Turning to the example device being designed (e.g., the table 204), this table 204 may be modeled geometrically as having a tabletop portion 206 and a plurality of leg elements 208. The design application 120 may characterize and model various subcomponents of the table within a convenient Cartesian coordinate system. Turning to the tabletop 206 as an example, the design application may track parameters indicating a length 210 of the tabletop, a thickness 212, and/or a width 214. Although not shown explicitly in FIG. 2, the design application may track similar parameters as related to the various leg elements 208.

In general, the design application 120 may maintain a geometric definition 216 corresponding to a device or system (e.g. the table 204) being designed with the design application 120. In addition, the geometric definition may include respective definitions for various subcomponents included within the overall device or system. In the example shown, the geometric definition 216 for the table may include at least a sub-definition element 218 for the tabletop and one or more sub-definition elements 220 for the table legs. In turn, the tabletop definition element 218 may include a sub-element 222 that specifies the appropriate x, y, and z values that define the geometric model for the tabletop. Likewise, the leg definition element 220 may define a sub-element 224 that specifies the appropriate x, y, and z values that define the geometric models for the various table legs.

As described in further detail in the examples below, the user 106 may give various commands, for example in the form of the program code/script elements 122, that may change, add, or delete various aspects of the geometric definition 216, or sub-elements thereof. In turn, the design application 120 may generate new program outputs 132 in response to these commands. More specifically, the design application 120 may cooperate with the lazy evaluation module 124 to improve the efficiency with which the design application may generate the program outputs.

As examples of the foregoing improvements in efficiency, assume that the user 106 issues commands in the form of program code that changes the length 210 of the tabletop 206. In response to these commands, the design application may identify which geometric aspects of the table are impacted by the change in the length of the tabletop. In this example, the design application may determine that only the geometric definition of the tabletop element (e.g., 218) is impacted by the change in length, and may further determine that the geometric definitions of the various table leg elements (e.g., 220) remain unchanged. In turn, the design application may refer to the geometric definition 218 for the tabletop, and may recompute only the impacted geometric elements 222. However, the table leg element 220 and related geometric definitions 224 may remain unchanged. In general, the design application 120 may decrease user wait time by avoiding the recompute operations associated with unchanged elements.

In an example in which the user lengthens the tabletop sufficiently, the design application 120 may add additional table legs 208, as may be specified by applicable design rules. In such cases, the design application 120 may instantiate additional definition elements 220 and/or 224 for the added table legs, but need not recompute the geometric definitions of any of the table legs.

In another example, assume that the user 106 issues commands that change the thickness 212 of the tabletop 206. In this example, the design application 120 may again determine that this change in tabletop thickness impacts only the geometric definitions of the tabletop, but may also determine that the geometric definitions of the table legs 208 remain unchanged. Accordingly, the design application may improve the efficiency of the recompute operation that results from this change by recomputing only the geometric definitions of the tabletop elements.

Having described the operational examples provided in FIG. 2, the discussion now proceeds to a description of additional aspects of the program code/script and related processing by components of the design application. This description is now provided with FIG. 3.

Figure 3:
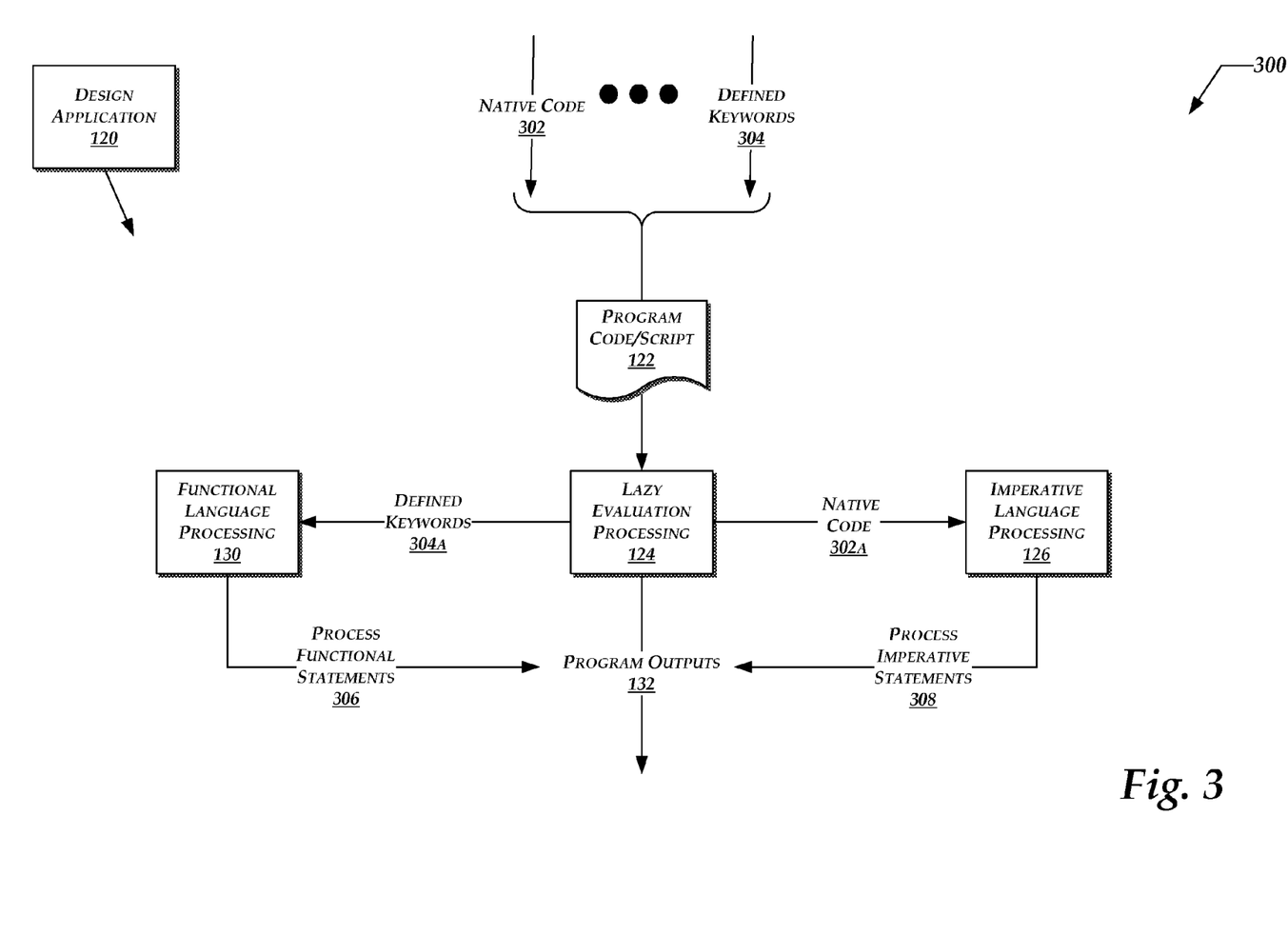
FIG. 3 illustrates additional aspects of program code/script for the lazy evaluation techniques described herein, along with related processing that a design application may perform according to these techniques.

FIG. 3 illustrates additional aspects, denoted generally at 300, of the program code/script and related processing by components of the design application. To facilitate reference and description, but not to limit possible implementations, FIG. 3 may carry forward some items described previously, as denoted by similar reference numbers. For example, FIG. 3 carries forward the program code/script 122, as well as the lazy evaluation processing component 124, the imperative language processing component 126, and the functional language processing component 130.

Turning to the program code/script 122 in more detail, the program code may include one or more statements as supported by a given programming language, denoted as native code 302 in FIG. 3. Put differently, the native code 302 may be consistent with syntax rules defined by the given programming language. The program code may also include one or more additional defined functions, denoted at 304. These additional defined functions may be added to the stream of program code 122 in order to facilitate the tools and techniques described herein. This description now proceeds with several source code examples to illustrate these tools and techniques.

The following set of examples uses syntax defined by the Python/Jython (referred to as "Python") programming languages. As a starting point, consider the existing behavior of this example of unmodified Python language. This set of expressions would produce the following behavior:
a=1
b=2
c=a+b
print "c is now", c
Executing these statements would produce as output:
>>>c is now 3
The next several statements change one of the values used by the expression to define "c":
a=5
print "c is now", c
Executing these statements would produce as output:
>>>c is now 3
In the preceding example, the statement c=a+b was not re-evaluated, even though one of its input parameters changed values. This behavior may be typical for Python or any procedural programming language.

Now, consider a new example including a defined function called "Rule" added to the Python code:
a=1
b=2
c=Rule(lambda: a+b)
print "c is now", c
Executing these statements would produce as output:
>>>c is now 3
Continuing this example, the next sequence of statements may change one of the inputs to the rule for c, as follows:
a=5
print "c is now", c
Executing these statements would produce as output:
>>>c is now 7
Having provided the foregoing examples, several observations are noted. First, the "lambda" keyword included in the above example statements refers to a predefined Python function that converts an input expression into an unnamed function. Second, the function or class "Rule" is added to the default Python code, thereby augmenting the default Python code to perform the assessing described herein. Thus, the function "Rule" provides an example of the defined functions 304 shown in FIG. 3. However, it is noted that the name "Rule" is provided as an example only, and implementations of the description herein may use any suitable name. Typically, implementations of this description may choose names for the functions 304 that do not otherwise appear in syntax rules for the procedural language in which the native code 302 is written. Generally, the key word mechanism (e.g., "Rule") may refer to or incorporate any programming statement that may be expressed as a function (e.g., the lambda function in the previous example).

As shown in FIG. 3, the program code/script 122 may be input to the lazy evaluation processing component 124. In turn, the component 124 may identify any defined functions appearing in the input program code/script (e.g., "Rule"), and route them to the functional language component 130, as indicated at 304a. In turn, the functional language components 130 may process the defined functions and any input arguments, as represented generally at 306.

The lazy evaluation processing may also route native code to the imperative language component 126 as denoted at 302a. In turn, the imperative language components 126 may process the native code and any input arguments, as represented generally at 308. Finally, the program outputs 132 may include the results of the functional statement processing represented at 306 and the imperative statement processing represented at 308.

The foregoing examples illustrate how the tools and techniques described herein may extend an underlying dynamic programming language (e.g., Python) to support an additional or defined function (e.g., "Rule"). This function may be a built-in function or class with full access to a containing namespace or module level namespace, depending on the level in which the rule is embedded within a given sequence of source code statements. A given rule object may depend on other classes, objects, or functions in the same namespace, and this namespace (whether the module namespace or a class-instance namespace) may be enhanced to track dependencies.

A given rule maintains state information about itself. For example, this state information may enable the rule to track or determine whether it has been evaluated, whether any errors occurred in this evaluation, whether results of such evaluations have been cached, whether the rule depends on a variable whose changes in value may not be readily apparent to the rule, or the like. Rules as described herein may allow for lazy evaluation or strict evaluation of a function and/or constructor. In example implementations, users may select whether to perform lazy evaluation or strict evaluation by interacting with a toggle or flag mechanism specifies lazy or strict evaluation. A single given rule may exist without depending on any other rules. However, in cases in which a given rule depends upon one or more other rules, the rules may not explicitly depend upon one another, but may instead depend upon keywords. These keywords may reference other rules, thereby creating implicit dependencies between rules. A set of given rules may be declarative in nature, and that they have no predetermined order of execution. A set of rules with these implicit dependencies can be stored in a single namespace that is enhanced to mediate between the rules, and to track dependencies between the rules.

Rules may depend on keys read from the namespace. These keys may be other rules, but they may also be variables or functions. For example, the statement c=Rule(lambda: a+b) defines a rule that is associated with the keyword "c". When this rule is executed for the first time, "a" and "b" will be retrieved from the namespace, and as a result, the rule will update its state information to indicate that it depends on "a" and "b", without regard to the values "a" and "b".

Now, assuming a second rule: d=Rule(lambda: c+3), this rule will be associated with the keyword "d". When this rule is executed, it will retrieve "c", without knowing (or caring) that "c" is also a rule. However, by asking for "c", the first rule associated with "c" will execute as appropriate or return a cached value. The dependencies of any functions upstream and/or downstream a given rule (discussed in more detail below) are defined implicitly when the rule is created.

As illustrated in the above examples, the action of retrieving "c" from the namespace may cause or trigger evaluation of "c". By using this mechanism to evaluate expressions, the user may obtain additional insight into when functions wrapped by these "Rule" statements are executed. In addition, the mechanisms described herein may define respective private namespaces for different rules and their parameters, to prevent interference or conflicts with other user defined namespaces. Generally, the lazy evaluation mechanism may operate independently of the types specified for any particular parameter.

In the foregoing examples, the syntax of the native code is unchanged. In this manner, the lazy evaluation components 124 may support lazy evaluation concepts within an overall imperative programming framework, without requiring the user to write code in an unfamiliar functional language or to use an awkward application program interface (API), or programming syntax.

Additionally, in the examples above, the line of code that was encapsulated within the "Rule( )" was a function to be evaluated. In these examples, the "Rule( )" encapsulates a function because the Rule that is created describes some sort of dependency between different variables. In these examples, the expression for "c" depends on the input arguments "a" and "b". The function "lambda" in these examples is a built-in function in the Python language that changes certain expressions into an unnamed function, and therefore defers or delays evaluation of the expression.

This description also provides additional examples of source code incorporating the added function or class "Rule". The lazy evaluation component 124 may process these and other examples of the program code/script 122:

```
def add(x, y):
    print "Hi"
    return x+y
a=1
b=2
d=Rule(lambda: add(a, b))
print "d is now", d
```

Executing these statements would produce this output:
Hi
>>>d is now 3
Asking for the same value d again would return the cached value:
>>>d is now 3
In this example, the function "add" was not re-executed, and hence the execution output "Hi".

In the next example, changing one of the input variables results in re-evaluation of the rule, when the value of d is requested:
a=12
print "d is now", d
Executing these statements would produce the output:
Hi
>>>d is now 14

The lazy evaluation component 124 may also track dependencies of the rule definition, in this example, the function "add". This means that the source code may redefine the function "add" later, and this would cause a re-evaluation of the expression "d" the next time that the value of "d" was requested. Continuing the previous example, redefining the function "add" may result in the following:

```
def add(x, y):
    print "Oy"
    return (x−y)
print "d is now", d
```

Executing these statements may produce the output:
Oy
>>>d is now 10

Even though these examples used integers to demonstrate example functionality, the description herein may be used with any system- or user-defined data type, including objects. Another example typical scenario that may leverage this lazy mechanism to reduce computations in time intensive geometric operations follows:
length=250
span=120
body=Rule(Fuselage(length)) # result is a solid model
wing=Rule(Wing(span)) # result is a solid model
b797=Union(body, wing) # Boolean union of the two solids
In this example, these statements are fighting different rules for defining geometric definitions for an aircraft "body" and for an aircraft "wing". Changing the span of the wing element would not cause re-computation of the body element, thereby saving the time and resources that would otherwise be devoted to recomputing the geometric definition of the body element. Thus, this example elaborates further on the table example, as shown previously in FIG. 2.

The rule mechanism can also be embedded into object definitions, as shown by the following example:

```
class MyObject(Rules):
    def_init_(sell):
    Rules._init_(self)
    self.a=1
    self.b=2
    self.c=self.Rule(self.add)
    def add(self):
    print "Hi"
    return self.a+self.b
g=MyObject( ) # Creates and instance of the class MyObject
which inherits from Rules
print g.c # c is a rule based on the function "add"
```

Executing the above statements may result in the following output:

```
Hi
>>>3
```

A second evaluation of the same property returns a cached value:

```
print g.c
```

Thus, executing the above statement produces the following output:

```
>>>3
```

In the foregoing example, note that the output did not include the string "Hi", which indicates that the function "add" was not called.

Continuing this example, the following code changes one of the inputs as follows:

```
g.a=2
print g.c
```

Executing these statements produces the following output:

```
"Hi"
>>>4
```

The preceding example printed the string "hi". This result occurred because the lazy evaluation component 124 detected that the value of "c" was out of date, because the value of "a" had changed. Accordingly, the evaluation component 124 called the function "add" to update the value of "c".

The foregoing examples are provided only for use of description in illustrating example dependencies between variables. However, implementations of the description herein may define dependency relationships having arbitrary complexity.

Having described the additional aspects of the program code/script and related processing by components of the design application in connection with FIG. 3, the discussion now proceeds to a description of illustrative components and process flows for performing lazy evaluation. This discussion is now presented with FIG. 4.

Figure 4:
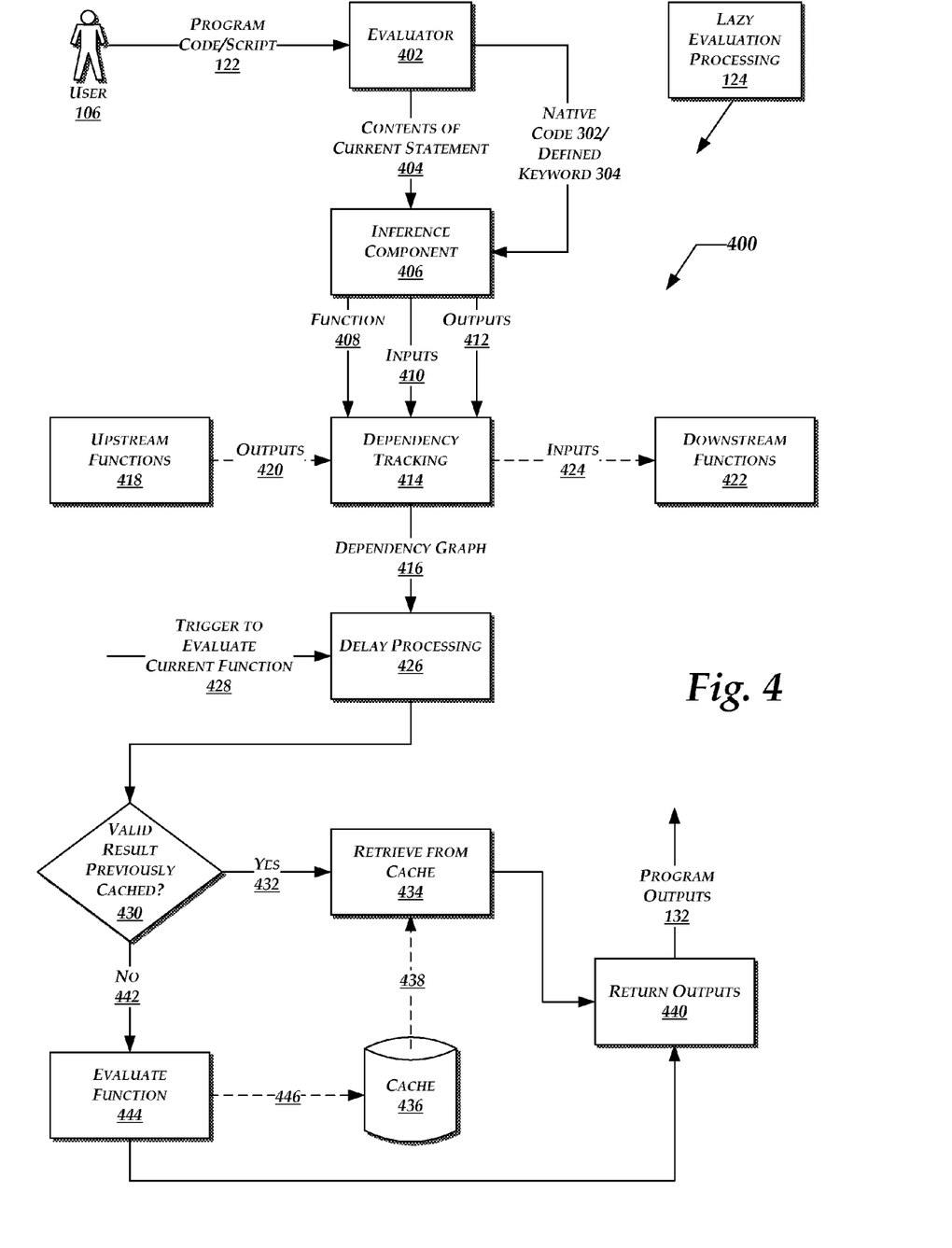
FIG. 4 illustrates components and process flows for performing lazy evaluations as described herein.

FIG. 4 illustrates components and process flows, denoted generally at 400, for performing lazy evaluations as described herein. To facilitate reference and description, but not to limit possible implementations, FIG. 4 may carry forward some items described previously, as denoted by similar reference numbers. For example, FIG. 4 carries forward the example user 106, the program code/script 122, as well as the lazy evaluation component 124, and the program outputs 132. In the example shown, the lazy evaluation component 124 may implement at least portions of the various components and process/data flows in FIG. 4.

Turning to FIG. 4 in more detail, an evaluator mechanism 402 may receive input program code/script (e.g., 122), which may include any number of respective statements. The evaluator 402 may digest or parse the contents of these statements into perspective contents or tokens, which are denoted generally at 404. The evaluator may or may not execute these statements, in different possible scenarios. As described previously, the input program code/script may include native code statements (e.g., 302 in FIG. 3), and may also include additional defined functions (e.g., 304 in FIG. 3). In instances where statements within the input program code/script contain additional defined functions (e.g., a "Rule" in the preceding examples), the evaluator mechanism may process contents of these statements without evaluating the statements as executable expressions. In turn, the evaluator 402 may pass these contents 404 to an inference component 406.

The inference component 406 processes the contents received from the parser 402, and infers the inputs and outputs of any expression or function defined within the contents. For example, in cases where additional functions define rules, the inference component 406 may infer the inputs and/or outputs of expressions or functions defined by such rules. FIG. 4 denotes examples of such functions at 408, denotes inputs to such functions at 410, and denotes outputs from such functions at 412. In turn, the inference component 406 passes the function, along with its inputs and outputs, to a dependency tracking mechanism 414.

The dependency tracking mechanism 414 analyzes inputs and outputs of given functions, and builds a dependency graph 416 indicating how a given function relates to zero or more other functions. For example, the dependency graph 416 may be "null", in the sense that the graph represents a rule or function whose inputs are not outputs from another rule or function. In example implementations, the graph 416 may be a directed acyclic graph.

In some scenarios, a given function may depend on zero or more upstream functions 418, in the sense that outputs 420 from the upstream functions are inputs to the given function. For example, a given function may be the starting point of a dependency graph, and in these cases, no functions would be upstream of the given function. In other cases, the given function may depend on one or more upstream functions.

In addition, one or more downstream functions 422 may depend on the given function, in the sense that outputs from the given function are inputs 424 to the downstream functions. In general, the dependency tracking mechanism 414 may track dependencies between inputs and outputs of a plurality of different functions, as well as definitions of the different functions themselves.

By analyzing the dependency graph 416, the dependency tracking mechanism 414 may infer when an input parameter to a given function has changed, thereby possibly driving a reevaluation of the given function. When the input parameter changes, the dependency tracking mechanism may mark as out of date the results of any functions that are downstream from this input parameter. For example, the dependency tracking mechanism may modify the dependency graph to indicate which inputs and/or outputs are out of date. In addition, the dependency tracking mechanism may process the dependency graph to identify any circular references existing between the inputs and outputs of different functions. If the dependency tracking mechanism locates any circular references, then the mechanism may report an appropriate error message to a user. In turn, the user may correct or resolve the circular reference before the dependency tracking mechanism processes the graph further.

The dependency tracking mechanism 414 may track dependencies between rules or functions implicitly, with the dependencies being updated while the rules or functions are executing. Each Rule is responsible for one function. The rule decides when to execute the function (e.g., based on whether a value has been cached for the function, whether the function's upstream dependencies have changed values, or the like). Just before the Rule executes the function, the Rule will register that it is monitoring the enhanced namespace where the function was defined. The enhanced namespace will tell any Rule that is currently registered every time a given key is accessed. Immediately after the function is executed, the Rule will remove itself as a listener. The Rule mechanism may execute this namespace registration code immediately before and after the function executes. The Rule class may be extended to add any other customized code that would execute before or after the function. For example, you could add code that would write out information to a log file immediately before and/or after the function was executed.

In this manner, the dependency tracking mechanism may relieve programmers from explicitly defining relationships between rules. Instead, the programmers may write rules that use various inputs, not explicitly defining relationships between rules and other rules, or between rules and various other inputs.

The dependency tracking mechanism may relieve programmers from checking that specified dependencies are consistent with the actual code. In addition, the tracking mechanism allows for scalability: if a programmer wishes to make a 600 line function into a rule, it would be difficult to define all of the dependencies within this function.

If the dependencies are defined explicitly, then a rule would depend on all of those explicitly defined dependencies. However, if the dependencies are created implicitly during execution of the rule, then the rule will depend only on the variables used to evaluate the rule at runtime, as an example, consider the following scenario:

def function( ):
   if a>0:
   return b
   else
   return c
a=1
b=2
c=3
d=Rule(lambda: function( ))
print ' d=', d
>>d=2

If dependencies between the values a, b, c, and d were defined explicitly, d would depend on a, b and c. However, in executing the above scenario, if the value of c were to change, the function would still return 2. The code involving c was never reached during execution, given the values assigned to a and b. By implicitly tracking dependencies of the variables (i.e., during execution), d only depends on the run-time values of a and b, which is more correct in execution scenarios.

A delay mechanism 426 may receive the dependency graph 416, and may delay evaluation of given functions within that dependency graph. Generally, the delay processing mechanism 426 may defer evaluating a given function until receiving an external trigger to evaluate the function. FIG. 4 denotes an example trigger at 428. Non-limiting examples of a trigger or triggering event may include explicit requests for the output of the given function, changes in input values upon which the given function may depend, or the like.

Once the trigger event has occurred, a decision block 430 may determine whether a valid output value for the given function already exists in a cache. Put differently, decision block 430 may evaluate whether an up-to-date output (i.e., not rendered obsolete by changing input values upstream of the given function) resides in the cache. If so, a Yes branch 432 leads to block 434, which represents retrieving the requested output from the cache. FIG. 4 denotes an example cache at 436, and generally represents outputs obtained from the cache at 438. In turn, block 440 represents returning the requested outputs as program outputs 132. In this manner, the process is shown in FIG. 4 may avoid re-evaluating a function when none of its inputs have changed, by retrieving previously-calculated results for the function using, for example, memorization techniques.

Returning to decision block 430, if the cache does not contain a current, valid output, a No branch 442 leads to block 444. Block 444 represents evaluating one or more rules to obtain results responsive to the trigger 428. Processing may reach block 444 for several different reasons, including for example, changing inputs to a given rule rendering obsolete the contents of the cache. In another scenario, the cache may not contain any relevant results, whether obsolete or not. In any case, the mechanisms shown in FIG. 4 may reevaluate a given rule when one of its inputs has changed, when a function associated with the rule changes, or when the function has not been evaluated previously.

Once block 444 has evaluated the functions and obtained results, block 444 may store these results in the cache 436, as represented at 446. In addition, processing may proceed from block 444 to block 440, to return the newly-evaluated results as program outputs 132.

Returning briefly to the table example shown in FIG. 2, this example may illustrate operations of different functions, as well as dependencies between these functions. For example, assume that one function governs the geometric definitions of the four table legs 208, and assume that another function governs the geometric definition of the tabletop 206. In this example, the dependency graph 416 may specify that the tabletop function depends upon the Cartesian coordinates input parameters for the tabletop itself, while the table leg function depends upon the Cartesian coordinates of the table legs. Accordingly, the dependency graph 416 may indicate that changes to the Cartesian coordinates of the table legs would have no effect upon the geometric definition of the tabletop. In addition, the dependency graph 416 may indicate that changes to the Cartesian coordinates of the tabletop would have no effect upon the geometric definition of the table legs. Therefore, if the user changes the Cartesian coordinates of the table legs, the dependency graph would indicate that only the geometric definitions of the table legs are to be updated.

The subject matter described above is provided by way of illustration only and does not limit possible implementations. Various modifications and changes may be made to the subject matter described herein without following the example embodiments and applications illustrated and described, and without departing from the true spirit and scope of the present description, which is set forth in the following claims.

What is claimed is:
1. A computer-based method comprising at least:
   evaluating input program code that includes at least one rule that is syntactically consistent with a procedural programming language, wherein the at least one rule wraps a first function defined by the procedural programming language;
   identifying at least one input and at least one output to the first function;

building a dependency graph that relates the first function to at least a second function, based on one of the input or the output to the first function;

analyzing the dependency graph, and further comprising marking as out of date at least one cached output of at least the second function, in response to detecting that the at least one input to at least the second function has changed value;

delaying evaluation of the first function, in response to the rule, until an occurrence of at least one triggering event; and evaluating at least the first function to produce at least one output in response to the triggering event, wherein the first function relates to a geometric design of at least one object.

2. The computer-based method of claim 1, wherein building the dependency graph includes relating the first function to at least one upstream function that generates at least one output that is the input to the first function.

3. The computer-based method of claim 1, wherein building the dependency graph includes relating the first function to a least one downstream function that receives as input the output of the first function.

4. The computer-based method of claim 1, wherein delaying evaluation of the first function includes deferring evaluation of the first function until the output of the first function is requested.

5. The computer-based method of claim 1, wherein delaying evaluation of the first function includes deferring evaluation of the first function until the at least one input to the first function has changed.

6. The computer-based method of claim 1, further comprising marking as out of date at least one cached output of the first function, in response to detecting that one of the at least one input to the first function or the first function has changed values.

7. The computer-based method of claim 1, further comprising receiving a request for an output of the first function, and further comprising determining whether a valid instance of the requested output exists in a cache.

8. The computer-based method of claim 7, further comprising retrieving the requested output from the cache.

9. The computer-based method of claim 7, further comprising determining that the cache contains an out of date instance of the requested output, reevaluating the first function, and re-caching a refreshed instance of the requested output.

\* \* \* \* \*